(12) United States Patent
Li et al.

(10) Patent No.: US 8,692,274 B2
(45) Date of Patent: Apr. 8, 2014

(54) LIGHT EMITTING DIODE PACKAGE STRUCTURE

(75) Inventors: Chao-Wei Li, Hsinchu (TW);
Chen-Peng Hsu, Kaohsiung (TW);
Yao-Jun Tsai, Taoyuan County (TW);
Hung-Lieh Hu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/448,413

(22) Filed: Apr. 17, 2012

(65) Prior Publication Data

US 2012/0199862 A1 Aug. 9, 2012

Related U.S. Application Data

(63) Continuation-in-part of application No. 12/575,470, filed on Oct. 8, 2009, now Pat. No. 8,178,890.

(30) Foreign Application Priority Data

Feb. 24, 2009 (TW) .............................. 98105780 A

(51) Int. Cl.
*H01L 33/00* (2010.01)
(52) U.S. Cl.
USPC ............................................. 257/98; 257/99
(58) Field of Classification Search
None
See application file for complete search history.

(56) References Cited

U.S. PATENT DOCUMENTS

| | | |
|---|---|---|
| 6,841,933 B2 | 1/2005 | Yamanaka et al. |
| 7,288,298 B2 | 10/2007 | Huang et al. |
| 2002/0149312 A1 | 10/2002 | Roberts et al. |
| 2003/0098460 A1 | 5/2003 | Yasukawa et al. |
| 2004/0069999 A1 | 4/2004 | Lin et al. |
| 2004/0104460 A1 | 6/2004 | Stark |
| 2004/0113549 A1 | 6/2004 | Roberts et al. |
| 2004/0227149 A1 | 11/2004 | Ibbetson et al. |
| 2005/0224829 A1 | 10/2005 | Negley et al. |
| 2006/0244118 A1 | 11/2006 | Roberts et al. |
| 2007/0297108 A1 | 12/2007 | Collins, III et al. |
| 2008/0013316 A1 | 1/2008 | Chiang |
| 2008/0087907 A1 | 4/2008 | Park et al. |
| 2009/0236621 A1 * | 9/2009 | Chakraborty ................... 257/95 |
| 2009/0272996 A1 | 11/2009 | Chakraborty |
| 2010/0163907 A1 * | 7/2010 | Hsu et al. ........................ 257/98 |

OTHER PUBLICATIONS

"Office Action of Taiwan Counterpart Application", issued on Aug. 15, 2012, p. 1-p. 7.
"Office Action of Taiwan Counterpart Application", issued on Oct. 29, 2012, p. 1-p. 7.

* cited by examiner

*Primary Examiner* — Thien F Tran
(74) *Attorney, Agent, or Firm* — Jianq Chyun IP Office

(57) ABSTRACT

A light-emitting diode (LED) package structure including a carrier substrate, at least one LED chip, an optical element and a thermal-conductive transparent liquid is provided. The LED chip is disposed on the carrier substrate and has an active layer. The optical element is disposed on the substrate and forms a sealed space with the carrier substrate, and the LED chip is disposed in the sealed space. The thermal-conductive transparent liquid fills up the sealed space.

2 Claims, 8 Drawing Sheets

LIGHT EMITTING DIODE PACKAGE STRUCTURE

CROSS-REFERENCE TO RELATED APPLICATION

This application is a continuation-in-part application of and claims the priority benefit of U.S. patent application Ser. No. 12/575,470, now allowed, which claims the priority benefit of Taiwan application serial no. 98105780, filed on Feb. 24, 2009. The entirety of each of the above-mentioned patent applications is hereby incorporated by reference herein and made a part of specification.

TECHNICAL FIELD

The disclosure relates to a light emitting diode (LED) package structure.

BACKGROUND

In recent years, since the luminous efficiency of LED has been constantly improved, the LED gradually replaces a fluorescent lamp and an incandescent bulb in many fields, such as the light source of a scanner which requires high speed response, the backlight or front-light source of a liquid crystal display device, lighting for the dashboard of a vehicle, traffic lights and common illumination devices. The LED converts electrical energy into light. When the electric current is applied to the LED, energy is released in the form of light through the combination of the electrons and holes, so as to achieve the illumination purpose.

FIG. 1 schematically illustrates a cross-sectional view of a conventional LED package structure. Referring to FIG. 1, the conventional LED package structure 100 includes a LED chip 110, a carrier substrate 120, conductive lines 132 and 134 and a molding compound 140. The LED chip 110 is disposed on the carrier substrate 120. Each of the conductive lines 132 and 134 electrically connects the LED chip 110 and the carrier substrate 120. The molding compound 140 is disposed on the carrier substrate 120 and covers the conductive lines 132 and 134. A voltage difference is applied to the LED chip 110 through the conductive lines 132 and 134, and thereby an active layer 112 of the LED chip 110 emits light and generates thermal. If the heat generated by the active layer 112 of the LED chip 110 cannot be released effectively, the LED chip 110 is easily damaged for being overheated particularly when it is driven in a high current.

SUMMARY

The disclosure provides a LED package structure, having a thermal conductive structure therein to enhance the thermal conduction efficiency of the whole package.

According to one embodiment, a LED package structure includes a carrier substrate, at least one LED chip, an optical element and a thermal-conductive transparent liquid. The carrier substrate includes a plurality of embedded channels or a plurality of conductive vias therein. The LED chip is disposed on the carrier substrate and has an active layer. The optical element is disposed on the substrate and forms a sealed space with the carrier substrate, and the LED chip is disposed in the sealed space. The thermal-conductive transparent liquid fills up the sealed space.

According to another embodiment, a LED package structure includes a carrier substrate, at least one thermal-conductive structure, at least one LED chip, an optical element and a thermal-conductive transparent liquid. The thermal-conductive structure is disposed on the substrate. The LED chip is disposed over the carrier substrate. The optical element is disposed on the carrier substrate and forms a sealed space with the carrier substrate, and the thermal-conductive structure and the LED chip are disposed in the sealed space. The thermal-conductive transparent liquid fills up the sealed space.

In view of above, the thermal-conductive transparent liquid fills up the sealed space. Accordingly, the carrier substrate and the thermal-conductive structure below the LED chips help to increase the thermal conduction efficiency of the bottom of the LED chip, and the thermal-conductive transparent liquid in contact with the LED chip helps to increase the thermal conduction efficiency of the sidewall and top of the LED chip.

In order to make the aforementioned and other objects, features and advantages of the disclosure comprehensible, a preferred embodiment accompanied with figures is described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
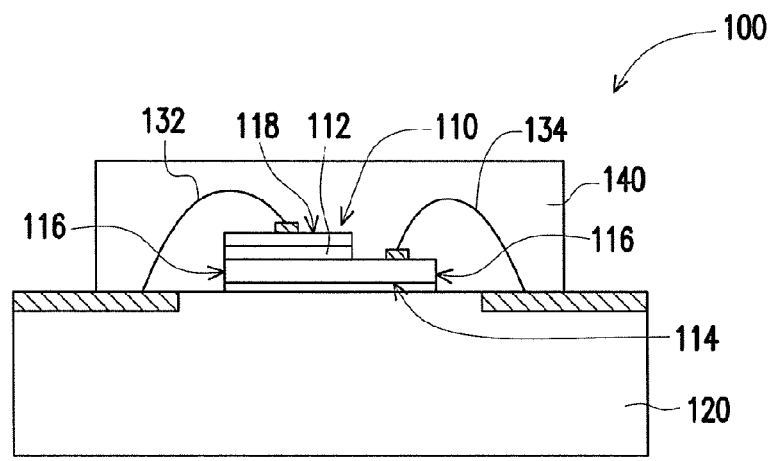
FIG. 1 schematically illustrates a cross-sectional view of a conventional LED package structure.
Figure 2:
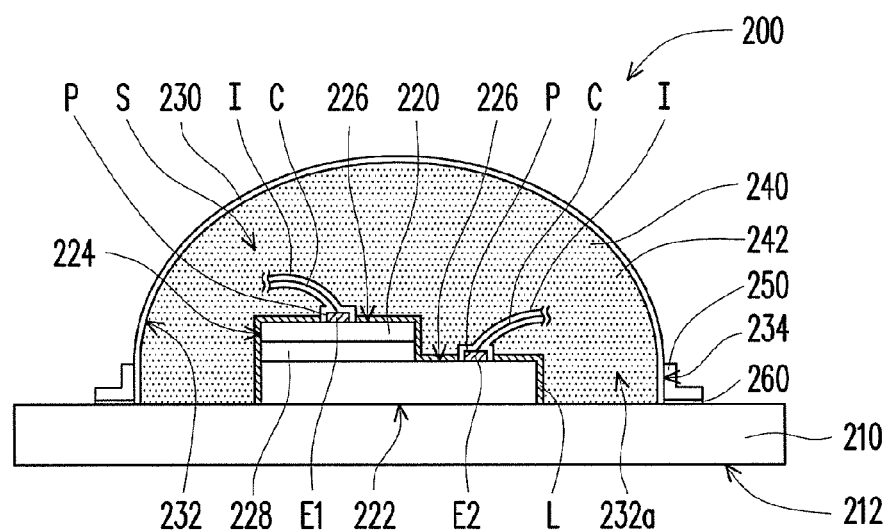
FIG. 2 schematically illustrates a LED package structure according to an embodiment of the disclosure.

FIG. 2 is a schematic cross-sectional view illustrating a LED package structure according to one embodiment. Referring to FIG. 2, a LED package structure 200 includes a carrier substrate 210, a LED chip 220, an optical element 230 and a thermal-conductive transparent liquid 240. The carrier substrate 210 may be a thermal-conductive substrate, such as an aluminum oxide ($Al_2O_3$) substrate, an aluminum nitride (AlN) substrate, a copper substrate, a ceramic substrate or an aluminum substrate, etc. In this embodiment, the thermal conductivity of the thermal-conductive substrate is generally above 25 W/mK, for example. The LED chip 220 is disposed on the carrier substrate 210 and has an active layer 228. The LED chip is electrically connected to the carrier substrate 210 through wires C. In this embodiment, if a specific color light such as white light is required, a light conversion layer L is optionally formed on the light emitting path of the LED chip 220. In details, the light conversion layer L can be directly attached to the surface of the LED chip 220, so as to increase the uniformity of the light. Alternatively, the light conversion layer L can be indirectly attached to the surface of the LED chip 220. Further, to improve the thermal dissipation efficiency of the carrier substrate 210, a thermal sink (not shown) is optionally disposed on a surface 212 of the carrier substrate 210 away from the LED chip 220.

The optical element 230 is disposed on the carrier substrate 210. The optical element 230 and the carrier substrate 210 form a sealed space S, and the LED chip 220 is disposed in the sealed space S. Specially, in this embodiment, the optical element 230 is in arc shape and has a recess 232. The arc shape helps to increase the directivity of light. The carrier substrate 210 is disposed on an open side 232a of the recess 232, so as to seal the recess 232 and form the sealed space S. The optical element 230 includes a material with high transparency such as glass, for example. The optical element 230 is a lens, for example. In this embodiment, the optical element 230 is transparent with respect to at least a portion of the wavelength of the light emitted from the LED chip 220. For example, the optical element 230 is transparent with respect to the wavelength of the visible light.

The material of the optical element 230 includes glass, epoxy resin or transparent plastic, for example. The transparent plastic is olefinic transparent plastic or aliphatic transparent plastic (e.g. polypropylene or polyethylene), and is not prone to degrade when in contact with the aprotic solvent such as a solution containing propylene carbonate. The material of the transparent plastics is selected from the group consisting of cyclic olefin copolymers, polymethylpemtenes, hydrogenated cyclo-olefin polymers and amorphous cyclo-olefin copolymers.

The thermal-conductive transparent liquid 240 fills up the sealed space S and is a liquid of high fluidity and high thermal conductivity. In this embodiment, the thermal conductivity of the thermal-conductive transparent liquid 240 is greater than that of epoxy resin, and the light transmittance of the thermal-conductive transparent liquid 240 is more than about 50% with respect to the main wavelength of the light emitted from the LED chip 220. The thermal-conductive transparent liquid 240 directly contacts with the surface of the carrier substrate 210, the optical element 230 and the LED chip 220 which are exposed to the sealed space S. Therefore, through the flow of the thermal-conductive transparent liquid 240, the heat generated by the LED chip 220 during illumination is transferred to the carrier substrate 210 and the optical element 230, and then transferred to the outside of the LED package structure 200 through the carrier substrate 210 and the optical element 230. In this embodiment, it is noted that the carrier substrate 210 below the LED chip 220 helps to increase the thermal conduction efficiency of the bottom 222 of the LED chip 220, and the thermal-conductive transparent liquid 240 in contact with the LED chip 220 helps to increase the thermal conduction efficiency of the sidewall 224 and the top 226 of the LED chip 220.

In this embodiment, to avoid short circuit between electrodes E1 and E2 of the LED chip 220, the thermal-conductive transparent liquid 240 is an electric insulated liquid, for example. The material of the thermal-conductive transparent liquid 240 is selected from the group consisting of silicon oils, paraffin oils, olive oils, propylene carbonate, perfluoropolyether (PFPE) and other liquids with high fluidity and high thermal conductivity. It is noted that when the thermal-conductive transparent liquid 240 is electricity-conductive, to avoid short circuit caused by the thermal-conductive transparent liquid 240, an insulating layer (the material thereof includes an insulating material) I can be formed on the conductive parts (e.g. pads P) of the LED chip 220, the electrical connection parts (e.g. conductive lines C) of the LED chip 220 and a portion of the active layer on the sidewall of the LED chip 220. Alternatively, the light conversion layer covering the LED chip 220 can also function as an insulation between the conductive parts and the thermal-conductive transparent liquid 240 when the thermal-conductive transparent liquid 240 is electricity-conductive.

In this embodiment, the thermal-conductive transparent liquid 240 may contain a plurality of suspended particles 242. For example, the thermal-conductive transparent liquid 240 is deionized (DI) water containing titanium oxide ($TiO_2$) particles. The suspended particles 242 can increase the refraction or reflection of the light emitted from the LED chip 220, so as to effectively increase the light emitting angle and avoid discomfort to the human eyes caused by the straight light.

The thermal-conductive transparent liquid 240 is a fluidic liquid under the room temperature, and the viscosity thereof is less than about 10,000 mPas, for example. In this embodiment, to prevent the thermal-conductive transparent liquid 240 from being frozen under low temperature, an antifreeze material such as methanol or ethylene glycol is added to the thermal-conductive transparent liquid 240, so as to maintain the fluidity.

Further, the LED package structure 200 can optionally has a sealing member 250. The sealing member 250 connects the carrier substrate 210 and the outer periphery 234 of the optical element 230 and is disposed outside the sealed space S. The material of the sealing member 250 includes metal or alloy, for example. One suitable example of the alloy is Fe—Co—Ni alloy (known as Kovar alloy). The sealing member 250 is connected to the carrier substrate 210 by metal to metal connection, so as to enhance the reliability of the connection between the sealing member 250 and the carrier substrate 210.

In this embodiment, three methods for connecting the optical element 230 to the sealing member 250 are provided for illustration purposes, and are not construed as limiting the disclosure. Method 1 is heating the optical element 230 to the glass transition temperature or softening temperature and then mounting the sealing member 250 on the outer periphery 234 of the optical element 230. Method 2 is metallizing (e.g. depositing metal such as titanium) the outer periphery 234 of the optical element 230, and bonding the optical element 230 to the sealing member 250 with solder (not shown). Method 3 is using a sealant (not shown) to bond the optical element 230 to the sealing member 250. The characteristics of the sealant is similar to that of glass and the softening temperature of the same is lower (e.g. lower than 700° C.).

In this embodiment, two methods for connecting the carrier substrate 210 to the sealing member 250 are provided for illustration purposes, and are not construed as limiting the disclosure. Method 1 is using a connection layer 260 to bond the sealing member 250 to the carrier substrate 210. The connection layer 260 is disposed between the sealing member 250 and the carrier substrate 210, and the material thereof includes metal or alloy (e.g. solder). The connection layer 260 is designed corresponding to the cross-sectional shape of the sealing member 250, such as circular, quadrilateral, elliptic etc. The connection layer 260 can enhance the adhesion between the sealing member 250 and the carrier substrate 210, so as to enhance the reliability of the whole package. Specifically, solder can be first formed on the carrier substrate

210. Thereafter, the sealing member 250 which has been connected to the optical element 230 is disposed on the solder and the solder is then heated.

Figure 3:
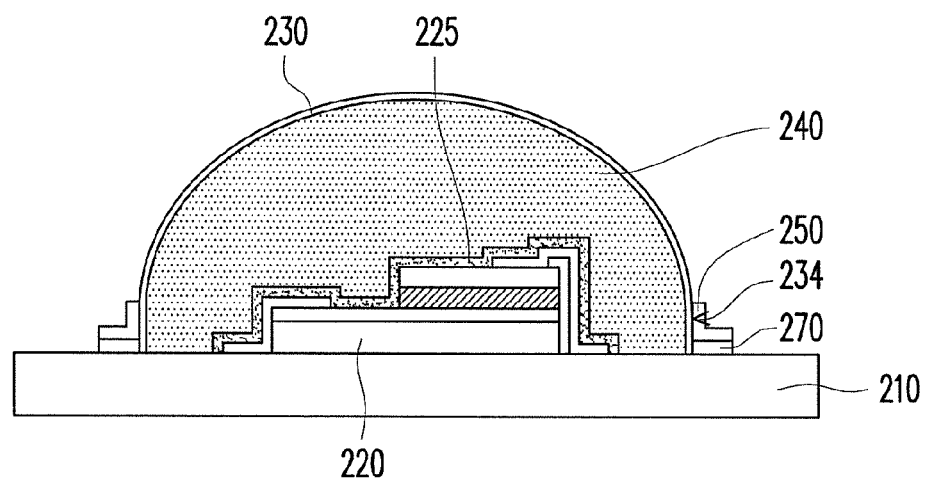
FIG. 3 schematically illustrates a modification of the LED package structure in FIG. 2.

FIG. 3 schematically illustrates a modification of the LED package structure in FIG. 2. Referring to FIG. 3, method 2 is fixing a fixed component 270 on the carrier substrate 210. The method of fixing the fixed component 270 on the carrier substrate 210 is by bonding the fixed component 270 to the carrier substrate 210 through solder (not shown) or adhesive (not shown) or co-sintering ceramics powder, or by forming the fixed component 270 and the carrier substrate 210 as a whole piece. Thereafter, the sealing member 250 which has been connected to the optical element 230 is disposed on the fixed component 270. Afterwards, the connection portion between the sealing member 250 and the fixed component 270 is heated by point discharge or laser welding, for example. The fixed component 270 and the sealing member 250 include the same material, such as Fe—Co—Ni alloy or Invar, for example.

Preferably, the growth substrate (i.e. the sapphire substrate or the SiC substrate) of the LED chip 220 is removed before or after joining the LED chip 220 to the carrier substrate 210 of the package structure 200 for better thermal dissipation. As the LED chip 220 (without the growth substrate) is pretty thin, a conformal insulation layer 225 is formed to cover the top and the sidewalls of the LED chip 220 for better protection.

Figure 3A:
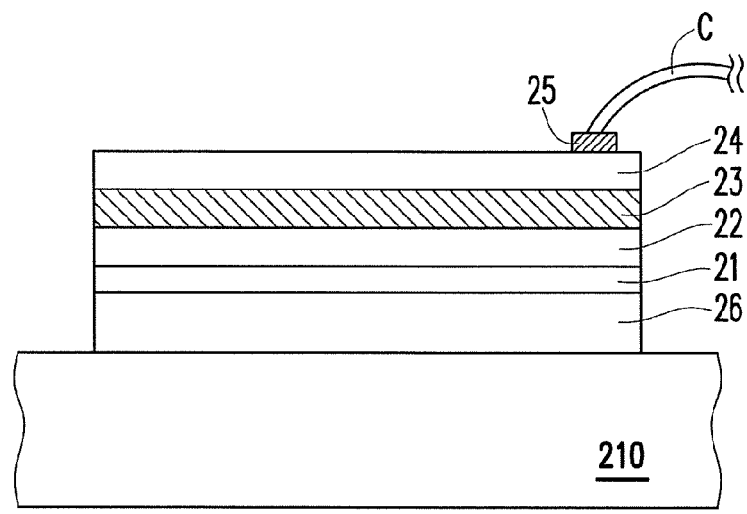
FIGS. 3A-3F schematically illustrate the structures of the LED chips according to embodiments of the disclosure.
Figure 3B:
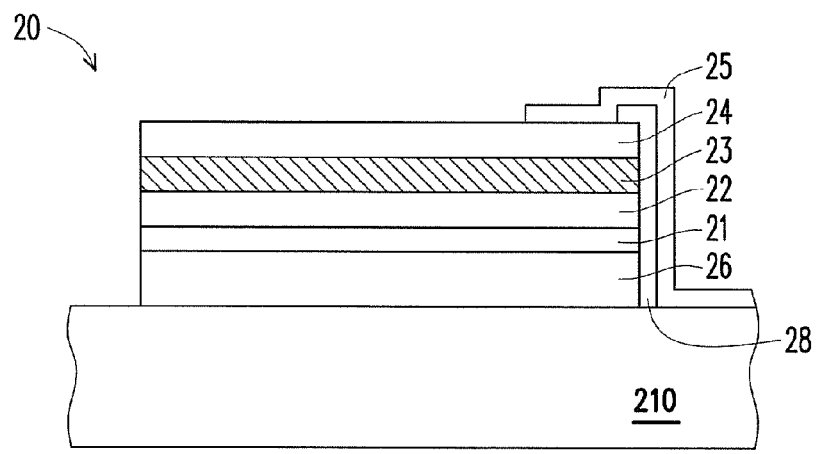
Figure 3C:
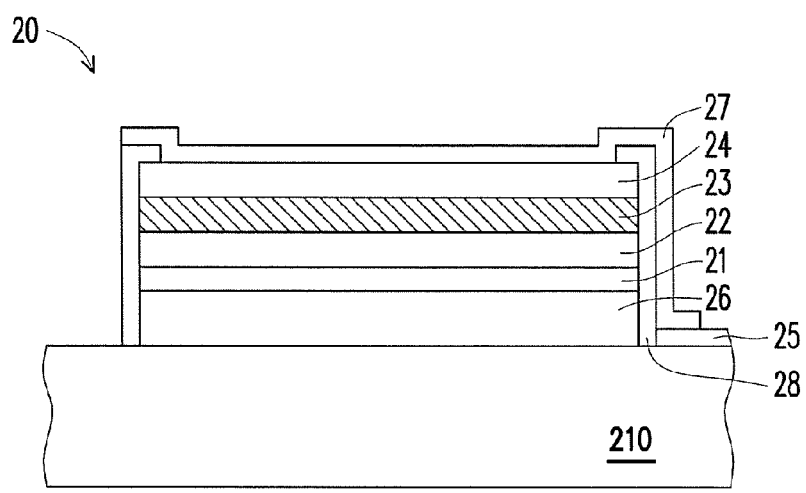

FIGS. 3A-3F schematically illustrate the structures of the LED chips applicable to the LED package structures according to several embodiments of the disclosure. As shown in FIG. 3A-3C, the light emitting chip 20 sequentially from bottom to top includes a first electrode layer 21, a first semiconductor layer 22, an active layer 23, a second semiconductor layer 24 and a second electrode 25. In principle, for better thermal dissipation, the growth substrate (i.e. the sapphire substrate or the SiC substrate) of the LED chip 20 is removed after attaching the LED chip 20 to the package structure. Hence, the LED chip 20 having no growth substrate is fixed to the substrate through a bonding layer 26. The material of the bonding layer 26 may be a conductive adhesive material or a solder material, for example.

Referring to an embodiment shown in FIG. 3A, the second electrode 25 is located on the top surface of the second semiconductor layer 24 and the LED chip 20 is electrically connected to the package structure through the conductive wire or line C.

Referring to an embodiment shown in FIG. 3B, the second electrode 25 extends from the top surface of the second semiconductor layer 24, along the sidewall of the LED chip 20 and extends to the carrier substrate 210, so as to electrically connect the LED chip 20 to the package structure. An insulating layer 28 is located between the second electrode 25 and the sidewall of the LED chip 20 for electrical insulation.

Referring to an embodiment shown in FIG. 3C, the second electrode 25 is located on the top surface of the carrier substrate 210, while a transparent conductive layer 27 extends from the top surface of the second semiconductor layer 24, along the sidewall of the LED chip 20 and connects to the second electrode 25, so as to electrically connect the LED chip 20 to the package structure. An insulating layer 28 is located between the transparent conductive layer 27 and the sidewall of the LED chip 20 for electrical insulation.

Figure 3D:
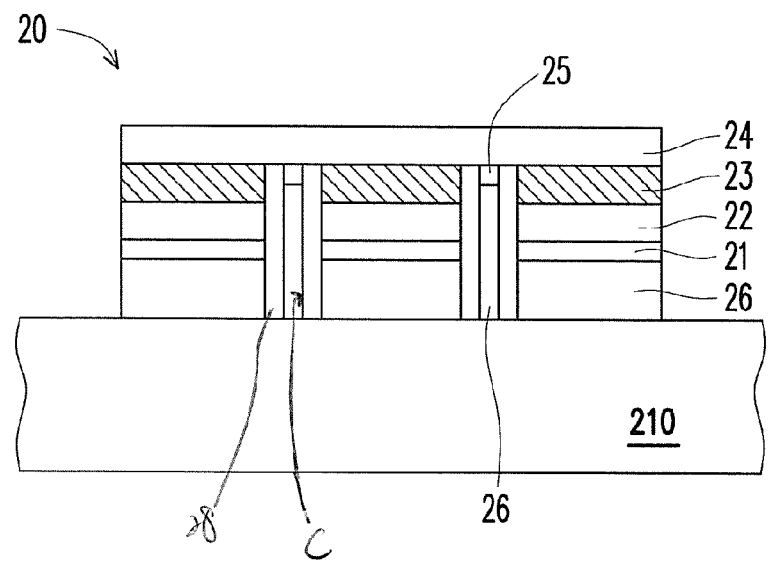

Referring to an embodiment shown in FIG. 3D, the LED chip 20 is a flip chip type LED, and the second electrodes 25 embedded in the channels C and on the second semiconductor layer 24 are electrically connected to the package structure through the bonding layer 26 filling in the channels C. The second electrode 25 and the bonding layer 26 in the channels C are isolated by the insulating layer 28.

Figure 3E:
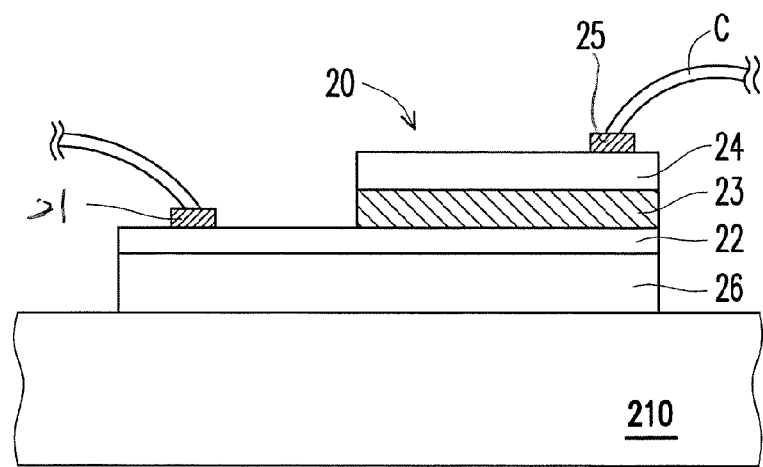
Figure 3F:
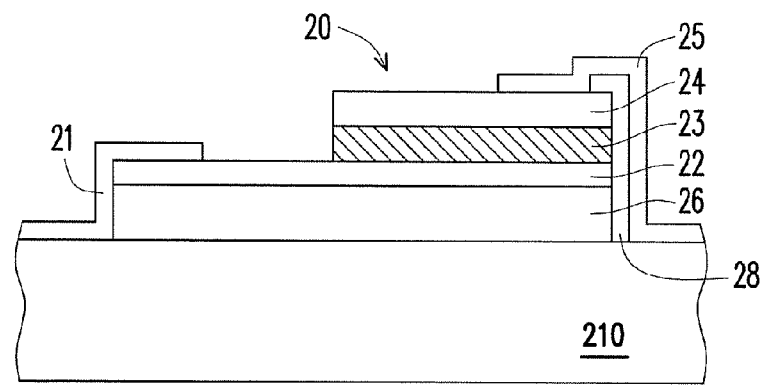

As shown in FIG. 3E-3F, the light emitting chip 20 is a horizontal type light emitting diode (LED), sequentially from bottom to top, including a first semiconductor layer 22, an active layer 23 and a second semiconductor layer 24 located on the carrier substrate 210. The LED chip 20 having no growth substrate is fixed to the carrier substrate 210 through a bonding layer 26. In FIG. 3E, the first electrode layer 21 is located on the first semiconductor layer 22, while the second electrode 25 is located on the second semiconductor layer 24. The first and second electrodes 21, 25 are electrically connected to the package structure through the conductive wire or line C. Alternatively, referring to an embodiment shown in FIG. 3F, the second electrode 25 extends from the top surface of the second semiconductor layer 24, along the sidewall of the LED chip 20 and extends to the top surface of the carrier substrate 210, so as to electrically connect the LED chip 20 to the package structure. An insulating layer 28 is located between the top electrode 25 and the sidewall of the LED chip 20 for electrical insulation. The first electrode 21 extends from the top surface of the first semiconductor layer 22, along the sidewall of the LED chip 20 and extends to the carrier substrate 210 to electrically connect the LED chip 20 to the package structure. When the bonding layer 26 is made of a conductive material, the first electrode 21 can be omitted, and the LED chip 20 can be electrically connected to the external power source through the bonding layer 26 and the substrate 210.

All of the above described LED chips are applicable for the LED package structures of this disclosure. Although the LED chips shown in FIGS. 2-3 may be horizontal type LEDs, other types of LED chips are also applicable for the LED package structures of FIGS. 2-3 and such modification can be feasible for the LED package structures described thereafter.

Figure 4A:
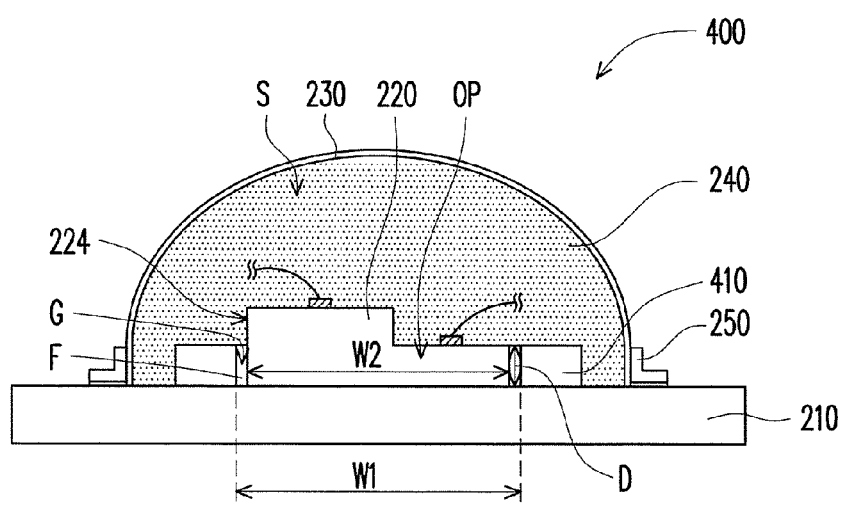
FIG. 4A schematically illustrates a LED package structure according to an embodiment of the disclosure.
Figure 4B:
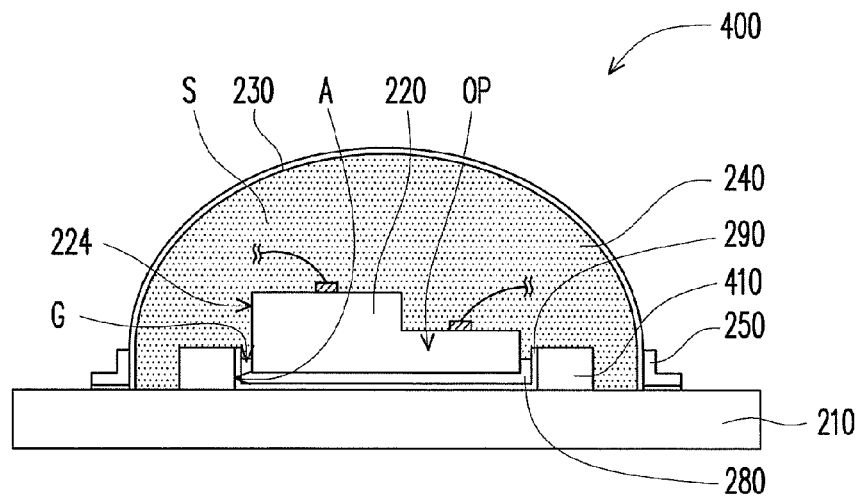
FIG. 4B schematically illustrates a possible modification of the LED package structure in FIG. 4A.

FIG. 4A schematically illustrates a cross-sectional view of a LED package structure according to another embodiment. FIG. 4B schematically illustrates a modification of the LED package structure in FIG. 4A. Referring to FIG. 4A, a LED package structure 400 includes a carrier substrate 210, a protrusion 410, a LED chip 220, an optical element 230 and a thermal-conductive transparent liquid 240. Further, the LED package structure 400 can optionally has a sealing member 250.

It is noted that the LED package structure 400 is similar to the LED package structure 200 in FIG. 2, and the difference lies in that the LED package structure 400 further has the protrusion 410. The difference between them is described in the following and the similar parts are not iterated herein.

The protrusion 410 is disposed on the carrier substrate 210 and has an opening OP to expose the carrier substrate 210. The material of the protrusion 410 includes a thermal-conductive material, such as metal or metal alloy. For example, the material of the protrusion 410 includes gold, silver, copper, indium, titanium, zinc, aluminum, lead, tin, nickel, platinum, chromium or a composite material with high thermal conductivity such as ceramics, for example.

The LED chip 220 is disposed on the carrier substrate 210 and in the opening OP. The protrusion 410 and the LED chip 220 are disposed in a sealed space S formed by the optical element 230 and the carrier substrate 210, and the thermal-conductive transparent liquid 240 directly contacts the whole surface of the carrier substrate 210, the optical element 230, the LED chip 220 and the protrusion 410 which are exposed to the sealed space S.

In other embodiments, if a specific color light is required, the depth D of the opening OP is increased (i.e. the thickness of the protrusion 410 is increased), so that the depth D of the opening OP is greater than the height of the LED chip 220 (i.e. the top surface of the LED chip 220 is lower than that of the protrusion 410), and fluorescent powder is filled in the opening OP.

The ratio of the cross-sectional width W1 of the opening OP to the cross-sectional width W2 of the LED chip 220 is larger than 1 and smaller than or equal to 1.5. In this embodiment, it is noted that the cross-sectional width W1 of the opening OP and the cross-sectional width W2 of the LED chip 220 are referred to the (smallest) width W1 of the opening OP and the (largest) width of the LED chip 220 in the same cross-section.

In view of above, the protrusion 410 is closer to the sidewall 224 of the LED chip 220, so that the protrusion 410 helps to increase the thermal conduction efficiency of the sidewall 224 of the LED chip 220.

In FIG. 4A, the ratio of the cross-sectional width W1 of the opening OP to the cross-sectional width W2 of the LED chip 220 is larger than 1 and smaller than or equal to 1.5, so that a gap G exists between the protrusion 410 and the sidewall 224 of the LED chip 220. An adhesive layer F fills up the gap G, and the material thereof is selected from the group consisting of silver paste, solder, glass, alloy and other suitable thermal-conductive materials, for example. Further, when the ratio of the cross-sectional width W1 of the opening OP to the cross-sectional width W2 of the LED chip 220 is larger than 1 and smaller than or equal to 1.5, the protrusion 410 and the carrier substrate 210 can be formed as a whole piece or separate pieces. In other words, the protrusion 410 and the carrier substrate 210 can be formed simultaneously, or formed separately and then assembled together. When the protrusion 410 and the carrier substrate 210 are formed separately, each of the protrusion 410 and the carrier substrate 210 includes a thermal-conductive material. In an embodiment, the material of the protrusion 410 is the same as that the carrier substrate 210. In another embodiment, the material of the protrusion 410 is different from that of the carrier substrate 210 and is a heat-conductive material. In yet another embodiment, the material of the protrusion 410 is partially the same as that of the carrier substrate 210.

Referring to FIG. 4B, in present embodiment, an adhesive layer 280 can be disposed in the gap G and between the LED chip 220 and the carrier substrate 210, so as to bond the LED chip 220 to the carrier substrate 210 and the protrusion 410. The material of the adhesive layer 280 is selected from the group consisting of silver paste, solder, glass, alloy and other suitable thermal-conductive materials, for example. Therefore, the adhesive layer 280 helps to increase the thermal conduction efficiency of the LED chip 220.

As described above, in present embodiment, the heat generated by the LED chip 220 during illumination is transferred to the carrier substrate 210 or/and the protrusion 410 which is in contact with the thermal-conductive transparent liquid 240, and then transferred to the outside of the LED package structure 400 through the carrier substrate 210 and the thermal-conductive transparent liquid 240, so as to increase the thermal conduction efficiency of the LED chip 220.

Further, in this embodiment, an intermediate layer 290 is formed on the inner wall A of the opening OP and on the portion of the carrier substrate 210 exposed by the opening OP. Said layer 290 may reflect the light emitted from the LED chip 220 and thus increase the light utility. The material of the intermediate layer 290, for example, includes silver or a material suitable for light reflection. Alternatively, the material of the intermediate layer 290 may be made of light-absorbing ones. In this case, the intermediate layer 290 serves to absorb the light emitted from the edge side of the LED chip 220 so as to increase the uniformity of light output. In other embodiments (not shown), when the ratio of the cross-sectional width W1 of the opening OP to the cross-sectional width W2 of the LED chip 220 is extremely close to 1, the sidewall 224 of the LED chip 220 is substantively attached to the protrusion 410.

Figure 5:
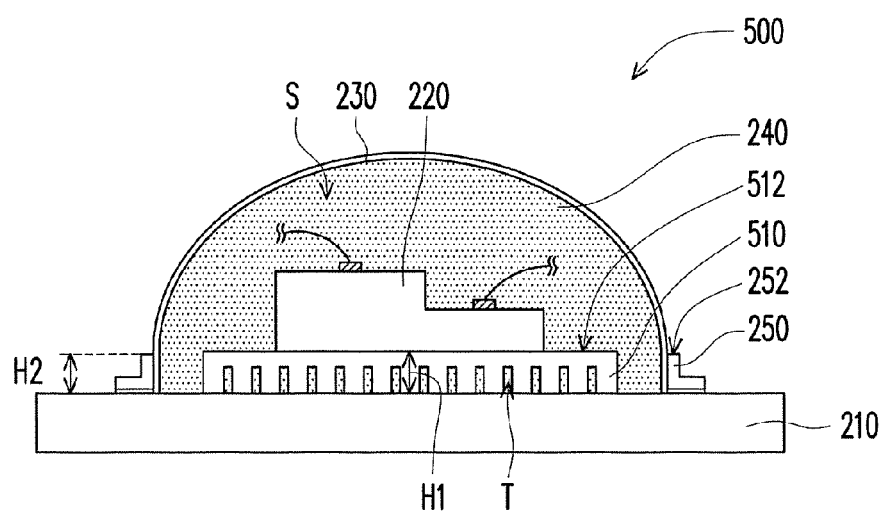
FIG. 5 schematically illustrates a LED package structure according to an embodiment of the disclosure.
Figure 6A:
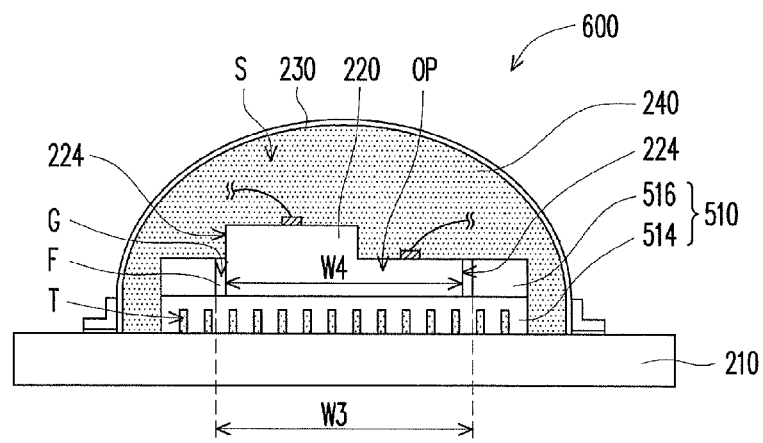
FIGS. 6A and 6B schematically illustrate two kinds of modifications of the
LED package structure in FIG. 5.
Figure 6B:
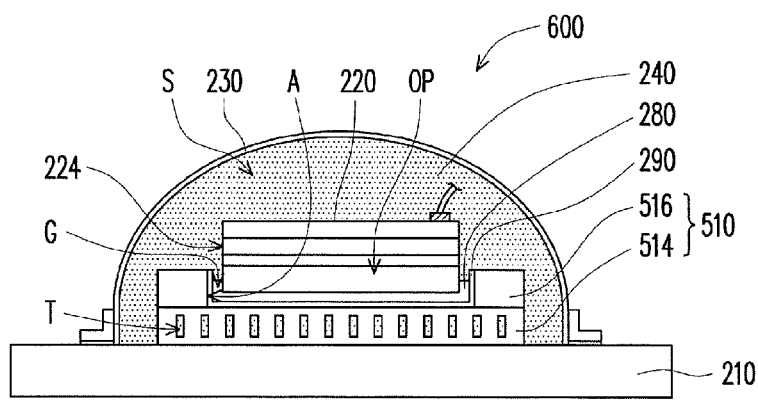

FIG. 5 schematically illustrates a cross-sectional view of a LED package structure according to another embodiment. FIG. 6A and 6B schematically illustrates two kinds of modifications of the LED package structure in FIG. 5.

Referring to FIG. 5, the LED package structure 500 of this embodiment includes a carrier substrate 210, a pedestal 510, a LED chip 220, an optical element 230 and a thermal-conductive transparent liquid 240. Further, the LED package structure 500 can optionally have a sealing member 250 and a fixed component (not shown).

It is noted that the LED package structure 500 is similar to the LED package structure 200 in FIG. 2, and the difference lies in that the LED package structure 500 further has the pedestal 510. The difference between them is described in the following and the similar parts are not iterated herein.

The pedestal 510 is disposed on the carrier substrate 210. The pedestal 510 has a plurality of grooves T open to the carrier substrate 210 and a first top surface 512 away from the carrier substrate 210. The material of the pedestal 510 includes a thermal-conductive material, for example. The LED chip 220 is disposed on the first top surface 512 of the pedestal 510. The pedestal 510 and the LED chip 220 are disposed in the sealed space S. The thermal-conductive transparent liquid 240 directly contacts the whole surface of the carrier substrate 210, the optical element 230, the LED chip 220 and the pedestal 510 which are exposed to the sealed space. The thermal-conducive transparent liquid 240 fills up the grooves T.

The grooves T of the pedestal 510 helps to increase the contact area between the pedestal 510 and the thermal-conductive transparent liquid 240.

Accordingly, when the heat generated by the LED chip 220 is transferred to the pedestal 510, the heat is removed from the pedestal 510 through the flow of the thermal-conductive transparent liquid 240, and thus the thermal conduction efficiency of the pedestal 510 is increased.

The sealing member 250 has a second top surface 252 away from the carrier substrate 210. The distance H1 between the first top surface 512 of the pedestal 510 and the carrier substrate 210 is greater than or equal to the distance H2 between the second top surface 252 of the sealing member 250 and the carrier substrate 210. Consequently, the LED chip 220 is elevated by the pedestal 510, so as to prevent the light emitted from the LED chip 220 from being blocked by the sealing member 250, thereby increasing the light extraction efficiency of the LED package structure 500.

Referring to FIG. 6A, in this embodiment, the pedestal 510 includes a base 514 and a protrusion 516. The protrusion 516 is disposed on the base 514 and has an opening OP to expose the base 514. The LED chip 220 is disposed on the base 514 and in the opening OP. The ratio of the cross-sectional width W3 of the opening OP to the cross-sectional width W4 of the LED chip 220 is larger than 1 and smaller than or equal to 1.5. It is noted that the protrusion 516 is closer to the sidewall 224 of the LED chip 220, so that the protrusion 516 helps to increase the thermal conduction efficiency of the sidewall 224 of the LED chip 220.

In FIG. 6A, the ratio of the cross-sectional width W3 of the opening OP to the cross-sectional width W4 of the LED chip 220 is larger than 1 and smaller than or equal to 1.5, so that a gap G exists between the LED chip 220 and the protrusion 516. An adhesive layer F fills up the gap G, and the material thereof is selected from the group consisting of silver paste, solder, glass, alloy and other suitable thermal-conductive materials, for example. The protrusion 516 is in contact with the thermal-conductive transparent liquid 240, so as to increase the thermal conduction efficiency of the sidewall 224 of the LED chip 220. The base 514 and the protrusion 516 are formed as a whole piece, for example.

Referring to FIG. 6B, in this embodiment, an adhesive layer 280 can be disposed in the gap G and between the LED chip 220 and the base 514, so as to bond the LED chip 220 to the base 514 and the protrusion 516. The material of the adhesive layer 280 is selected from the group consisting of silver paste, solder, glass, alloy and other suitable thermal-conductive materials, for example. Therefore, the adhesive layer 280 helps to increase the thermal conduction efficiency of the LED chip 220. The base 514 of the pedestal 510 has a plurality of grooves T embedded therein to assist heat dissipation.

Further, in this embodiment, an intermediate layer 290 is formed on the inner wall A of the opening OP and on the portion of the base 514 exposed by the opening OP. The intermediate layer 290 may reflect the light emitted from the LED chip 220 and thus increase the light utility. The material of the intermediate layer 290 may, for example, include silver or a material suitable for light reflection. Alternatively, the material of the intermediate layer 290 may be made of light-absorbing ones. In this case, the intermediate layer 290 serves to absorb the light emitted from the edge side of the LED chip 220 so as to increase the uniformity of light output.

In other embodiments, when the ratio of the cross-sectional width W3 of the opening OP to the cross-sectional width W4 of the LED chip 220 is extremely close to 1, the sidewall 224 of the LED chip 220 is substantially attached to the protrusion 516. Therefore, the protrusion 516 can transfer the heat generated by the LED chip 220 to the base 514 and to the thermal-conductive transparent liquid 240, and then to the carrier substrate 210, and the heat is then transferred to the outside of the LED package structure through the carrier substrate 210 and the thermal-conductive transparent liquid 240. In light of the aforementioned description, the heat generated by the LED chip 220 can be transferred to the protrusion 516 from the sidewall 224 of the LED chip 220 so the protrusion 516 attached to the sidewall 224 avails increasing the thermal conduction efficiency of the LED package.

Figure 7A:
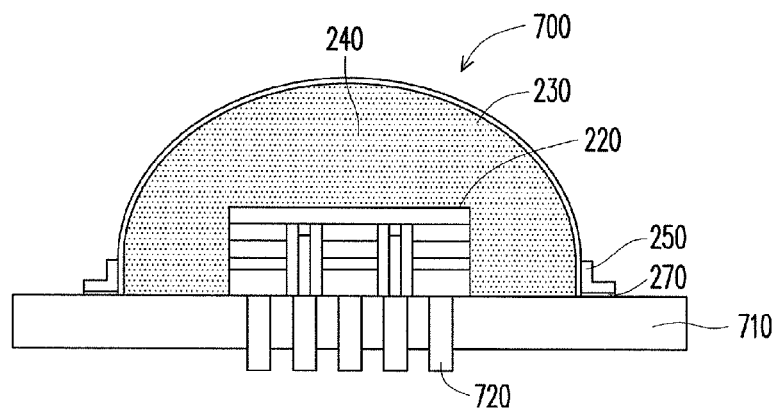
FIG. 7A schematically illustrates a cross-sectional view of a LED package structure according to another embodiment of the disclosure.
Figure 7B:
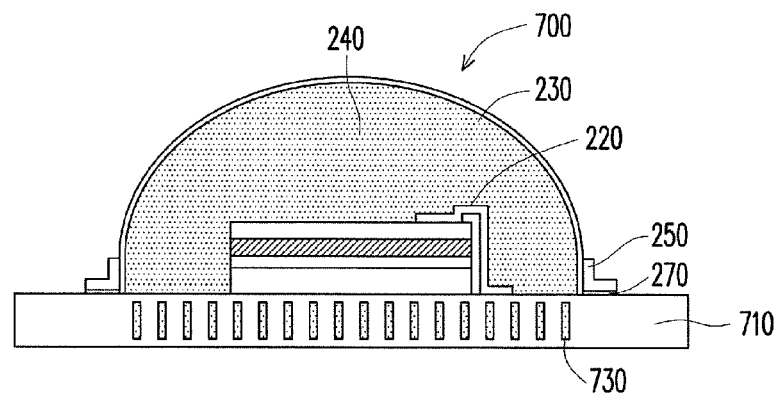
FIG. 7B schematically illustrates one possible modification of the LED package structure in FIG. 7A.

FIG. 7A schematically illustrates a cross-sectional view of a LED package structure according to another embodiment. FIG. 7B schematically illustrates one possible modification of the LED package structure in FIG. 7A.

Referring to FIG. 7A, in the embodiment, the LED package structure 700 of this embodiment includes a carrier substrate 710, a LED chip 220, an optical element 230 and a thermal-conductive transparent liquid 240. Further, the LED package structure 700 can optionally have a sealing member 250 and a fixed component 270. The carrier substrate 710 further includes a plurality of through-vias 720. The LED chip 220 can electrically connected to the package structure 700 through the through-vias 720. The through-vias 720 can also help dissipate the heat from the LED chip 220.

Referring to FIG. 7B, in the embodiment, the carrier substrate 710 has a plurality of channels 730 embedded therein to assist heat dissipation. In some embodiments, the channels 730 can be connected to each other, and are not construed as limiting the disclosure. The channels 730 can also comprise fluid therein to improve the thermal dissipation efficiency of the carrier substrate 710.

In summary, the carrier substrate below the LED chip helps to increase the thermal conduction efficiency of the bottom of the LED chip, and the thermal-conductive transparent liquid in contact with the LED chip help to increase the thermal conduction efficiency of the sidewall and top of the LED chip. By directly attaching the thinner LED chip without the growth substrate to the carrier substrate, the thickness of the package structure is reduced, which is beneficial for heat dissipation. The sealing member is adopted to bond the optical element to the carrier substrate, so as to fix the optical element on the carrier substrate to get a more reliable LED package. Further, the thermal conduction efficiency of the package structure can be increased by using the protrusion closer to the sidewall of the LED chip, by elevating the LED chip with the pedestal, or by providing conductive through-vias or the channels in the carrier substrate beneath the LED chip. Moreover, as the LED chip is elevated by the pedestal, the light emitted from the LED chip will not be blocked by the sealing member, thereby increasing the light extraction efficiency of the LED package structure. In addition, even though the structure or electrical connection between the LED package structure and LED chip and the structure or electrical connection between the LED package structure and an external power device are not described in the embodiments of the disclosure, the structure or electrical connection between the LED package structure and LED chip and the structure or electrical connection between the LED package structure and the external power device are well known to the one skilled in the art.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A LED package structure, comprising:
a carrier substrate;
at least one LED chip, disposed over the carrier substrate;
an optical element, disposed on the carrier substrate and forming a sealed space with the carrier substrate, wherein the at least one LED chip is disposed in the sealed space;
a thermal-conductive transparent liquid, filling up the sealed space;
a conformal insulation layer covering the at least one LED chip and isolating the at least one LED chip from the thermal-conductive transparent liquid;
a fixed component disposed directly on the carrier substrate; and
a sealing member disposed outside the sealed space and on the fixed component, wherein the sealing member, without directly contacting with the carrier substrate, connects the carrier substrate and an outer periphery of the optical element through the fixed component in-between, and wherein the at least one LED chip sequentially from bottom to top comprises:
a first semiconductor layer, fixed to the carrier substrate through a first bonding layer;
an active layer, disposed on the first semiconductor layer;
a first electrode layer, extending from a top surface of the first semiconductor layer to the carrier substrate, wherein the first electrode layer is separate from the active layer;
a second semiconductor layer, disposed on the active layer; and a second electrode layer, extending from a top surface of the second semiconductor layer to the carrier substrate and covering a side surface of the at least one LED chip.

2. The LED package structure of claim 1, wherein the at least one LED chip further comprises a first insulating layer located between the second electrode layer and the side surface of the at least one LED chip.

* * * * *